US 6,707,134 B1

(12) United States Patent
Li et al.

(10) Patent No.: US 6,707,134 B1
(45) Date of Patent: Mar. 16, 2004

(54) SEMICONDUCTOR STRUCTURE HAVING AN IMPROVED PRE-METAL DIELECTRIC STACK AND METHOD FOR FORMING THE SAME

(75) Inventors: Shin Hwa Li, Glendale, AZ (US); Annie Tissier, Scottsdale, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/632,388

(22) Filed: Aug. 3, 2000

Related U.S. Application Data

(63) Continuation of application No. 09/061,667, filed on Apr. 16, 1998.

(51) Int. Cl.$^7$ .............................................. H01L 23/58
(52) U.S. Cl. ...................... 257/637; 257/638; 257/644; 257/650; 257/760; 438/624; 438/692; 438/697
(58) Field of Search .................. 438/624, 633, 438/FOR 355, 692, 697, FOR 111; 257/638, 644, 650, 760

(56) References Cited

U.S. PATENT DOCUMENTS

| | | | |
|---|---|---|---|
| 4,983,546 A | 1/1991 | Hyun et al. ............... 438/800 |
| 5,169,491 A | 12/1992 | Doan ........................ 156/636 |
| 5,437,763 A | 8/1995 | Huang ........................ 216/18 |
| 5,503,882 A | * 4/1996 | Dawson ..................... 438/763 |
| 5,518,962 A | 5/1996 | Murao ....................... 438/624 |
| 5,560,802 A | 10/1996 | Chisholm ................ 156/636.1 |
| 5,567,661 A | 10/1996 | Nishio et al. .............. 438/631 |
| 5,661,084 A | 8/1997 | Kuo et al. .................. 438/624 |
| 5,747,381 A | * 5/1998 | Wu et al. ................... 438/624 |
| 5,783,482 A | 7/1998 | Lee et al. .................. 438/624 |
| 6,001,731 A | 12/1999 | Su et al. .................... 438/633 |
| 6,110,831 A | * 8/2000 | Cargo et al. |
| 6,127,261 A | * 10/2000 | Ngo et al. .................. 438/633 |
| 6,281,112 B1 | * 8/2001 | Sugiyama ................... 438/624 |

FOREIGN PATENT DOCUMENTS

| EP | 0599317 A1 | 6/1994 | ......... H01L/21/90 |
| JP | 08255791 | 10/1996 | ......... H01L/21/316 |
| JP | 09223740 | 8/1997 | ......... H01L/21/768 |

OTHER PUBLICATIONS

Wolf, Stanley, PhD., Silicon Processing for the VLSI Era, vol. 2–Process Integration, Lattice Press, Sunset Beach, vol. 2: 334–337, 1990.
Schaffer, W.J., et al., "BPSG Improves CPMP Performance for Deep Submicron Ics," Semiconductor International, 205–212, 1996.
Armstrong, W.E., et al., "A Scanning Electron Microscope Investigation of Glass Flow in MOS Integrated Circuit Fabrication," Journal of the Electrochemical Society, vol. 121, No. 2, 307–310, 1974.
Kerr, D.R., et al., "Stabilization of SiO2 Passivation Layers with P2O5," IBM Journal of Research and Development, vol. 8, No. 4, 376–384, 1964.

* cited by examiner

Primary Examiner—George Fourson
Assistant Examiner—Julio J. Maldonado
(74) Attorney, Agent, or Firm—David V. Carlson; Lisa K. Jorgenson

(57) ABSTRACT

A semiconductor structure includes a substrate, a dielectric layer disposed on the substrate, a layer of undoped silicate glass disposed on the dielectric layer, a layer of borophosphorous silicate glass on the layer of undoped silicate glass, and a planar dielectric layer disposed on the layer of borophosphorous silicate glass, the layers of undoped silicate glass, borophosphorous silicate glass, and planar dielectric together forming a pre-metal dielectric stack. The planar dielectric may include plasma-enhanced tetraethyl orthosilicate.

16 Claims, 2 Drawing Sheets

SEMICONDUCTOR STRUCTURE HAVING AN IMPROVED PRE-METAL DIELECTRIC STACK AND METHOD FOR FORMING THE SAME

CROSS-REFERENCE TO RELATED APPLICATION

This application is a continuation of pending U.S. patent application Ser. No. 09/061,667, filed Apr. 16, 1998.

TECHNICAL FIELD

The invention relates generally to a semiconductor structure that includes an improved pre-metal dielectric (PMD) stack, and more specifically to a structure that includes an undoped silicate glass/borophosphorous silicate glass/plasma-enhanced tetraethyl orthosilicate (USG/BPSG/PETEOS) PMD stack and a method for forming the same.

BACKGROUND OF THE INVENTION

Semiconductor processes for manufacturing integrated circuits often require forming a protective layer, or layers, to, e.g., reduce contamination by mobile ions, prevent unwanted dopant diffusion between different layers, and isolate elements of an integrated circuit. Typically, such a protective layer is formed with silicon-based dielectrics, such as silicon dioxide, which may take the form of undoped silicate glass (USG), borosilicate glass (BSG), or borophosphorous silicate glass (BPSG). BSG is typically formed by-doping USG with Boron. Likewise, BPSG is typically formed by doping USG with both Boron and Phosphorous. If these dielectrics are disposed beneath the first metal layer of the integrated circuit, they are often referred to as pre-metal dielectrics (PMD).

A conventional PMD stack often includes a USG layer disposed on a semiconductor substrate, and a BPSG layer disposed on the USG layer. Typically, a BPSG film layer has a number of advantages over a USG layer. For example, a BPSG layer is often a better moisture barrier than a USG layer. Also, the phosphorous ions in a BPSG layer trap mobile sodium (Na) or other ions. This phenomenon is called "gettering," and it is sometimes used to reduce or eliminate an unwanted shift in a transistor's threshold voltage $V_T$ caused by mobile ions trapped in the gate oxide of the transistor. Additionally, the Boron ions decrease the viscous flow temperature of the BPSG layer. This facilitates reflow of the BPSG layer, and thus improves the reflow planarization of the BPSG layer surface and allows for the filling of gaps with fewer voids. A downside of BPSG is that Boron and Phosphorous ions may diffuse from the BPSG into an underlying silicon region such as a silicon substrate. Such diffusion may cause undesirable changes in the doping profile of the silicon region. Therefore, to prevent such diffusion, the PMD stack includes a USG layer beneath the BPSG layer. The USG layer acts as a barrier to such diffusion.

FIG. 1 is a cross-section of a portion of a conventional semiconductor structure 1. The structure 1 has a patterned field-oxide layer 2 that defines active regions 8 in a semiconductor substrate 10. In one embodiment, the field oxide 2 has a thickness between approximately 3 k to 6 k angstroms. A gate structure 12 is disposed over the active region 8, and a layer 14 is disposed over a segment of the field oxide 2. A USG layer 4 having a thickness between approximately 1 k–2 k angstroms is conventionally formed over the surface of the structure 1. A relatively thick BPSG layer 6 having a thickness between approximately 12 k–25 k angstroms is subsequently formed over the USG layer 4. In one embodiment, the thickness of the BPSG layer 6 is at about 18 k angstroms.

Referring to FIG. 2, after the BPSG layer 6 has been formed, the structure 1 is planarized using a conventional chemical mechanical polishing (CMP) process. The CMP process reduces the combined thickness of all layers above the substrate 10, i.e., from the bottom of the field oxide 2 all the way to the top of the BPSG layer 6, to a value yk. In one embodiment, yk is approximately 12k angstroms. The layer 4 and the polished layer 6 form a PMD stack 17.

Referring to FIG. 3, an optional plasma-enhanced tetraethyl orthosilicate (PE-TEOS) redeposition dielectric layer 16 having a thickness between approximately 2 k–4 k angstroms may be conventionally formed over the polished BPSG layer 6. Therefore, when present, the layer 16 composes part of the PMD stack 17.

As the semiconductor industry increasingly relies on the CMP technique for planarization in today's high-density integrated circuits, drawbacks of the USG/BPSG PMD stack in connection with the CMP technique become more prominent. First, Boron and Phosphorous dopants in the BPSG layer 6 often are not uniformly distributed across and against the depth of the semiconductor wafer. This non-uniform distribution of the boron and/or phosphorous dopants often causes uneven thickness of the BPSG layer 6 even after CMP. Second, forming the BPSG layer 6, which is typically accomplished by a atmospheric pressure chemical vapor deposition (APCVD) process, is often a low-throughput and high maintenance process. As a result, using a relatively thick sacrificial BPSG layer 6 for the PMD 17 is often burdensome for manufacturing today's high-density integrated circuits. Additionally, the BPSG layer 6 often is too soft for a CMP process to adequately smoothen or planarize the surface of the layer 6.

SUMMARY OF THE INVENTION

In one embodiment of the invention, a semiconductor structure includes a substrate, a dielectric layer disposed over the substrate, an undoped silicate glass layer disposed over the insulator layer, a borophosphorous silicate glass layer disposed over the undoped silicate glass layer, and a planar dielectric layer disposed over the borophosphorous silicate glass, the undoped silicate glass layer, the borophosphorous silicate glass layer, and the planar dielectric layer together forming a pre-metal dielectric stack layer. In one embodiment, the planar dielectric layer includes plasma-enhanced tetraethyl orthosilicate.

DETAILED DESCRIPTION OF THE INVENTION

Figure 1:
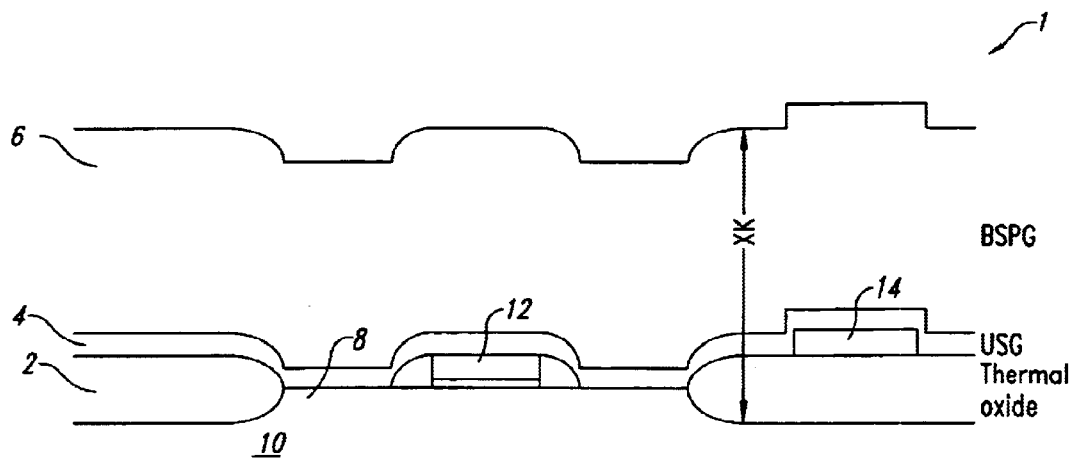
FIG. 1 is a cross-section of a conventional semiconductor structure.
Figure 2:
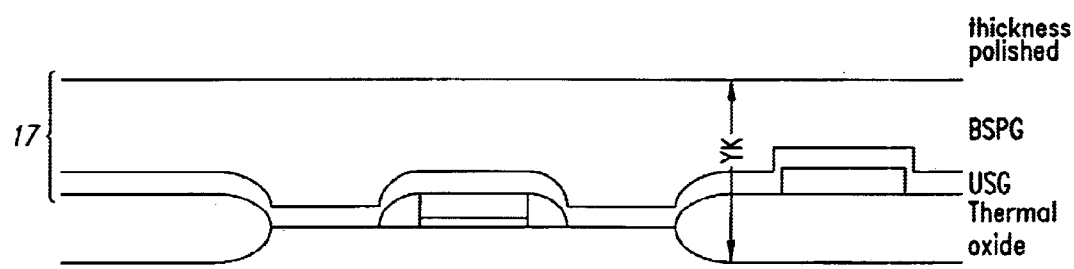
FIG. 2 shows the semiconductor structure of FIG. 1 after it has been subjected to a CMP process.
Figure 3:
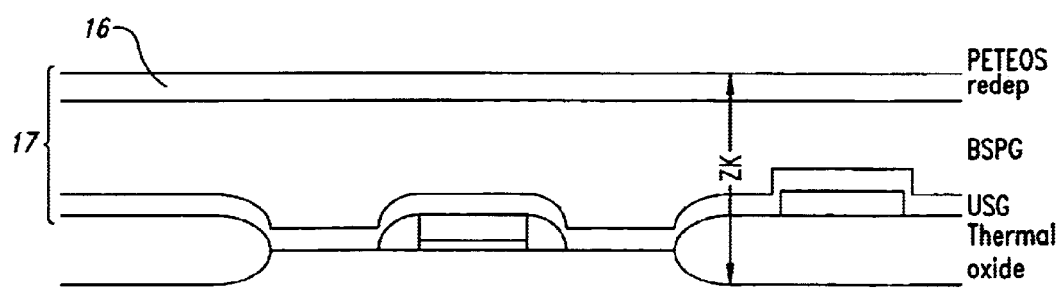
FIG. 3 shows the semiconductor stricture of FIG. 2 after the formation of an optional PE-TEOS redeposition layer.
Figure 4:
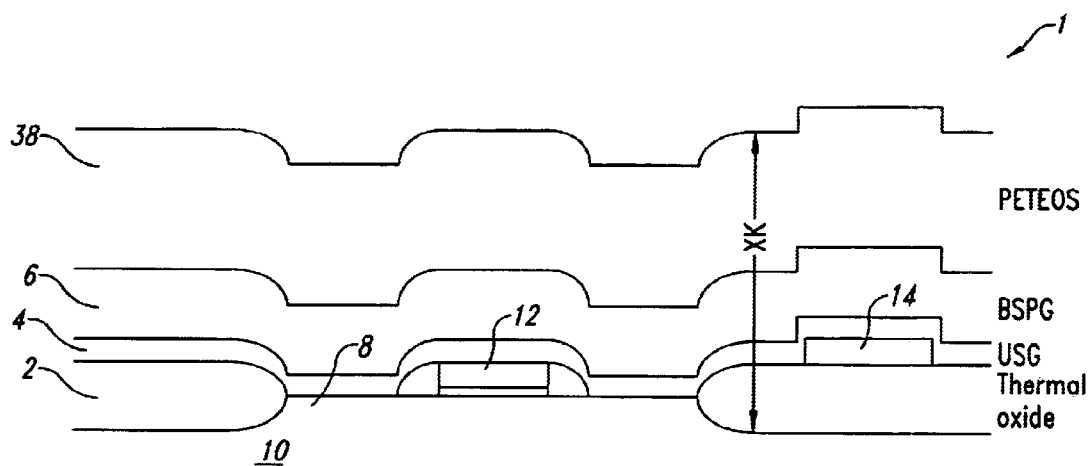
FIG. 4 is a cross-section of a semiconductor structure formed according to an embodiment of the invention.
Figure 5:
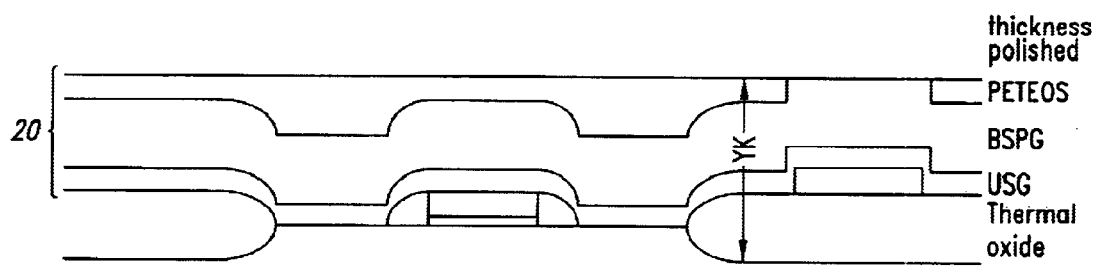
FIG. 5 shows the semiconductor structure of FIG. 4 after it has been subjected to a CMP process.
Figure 6:
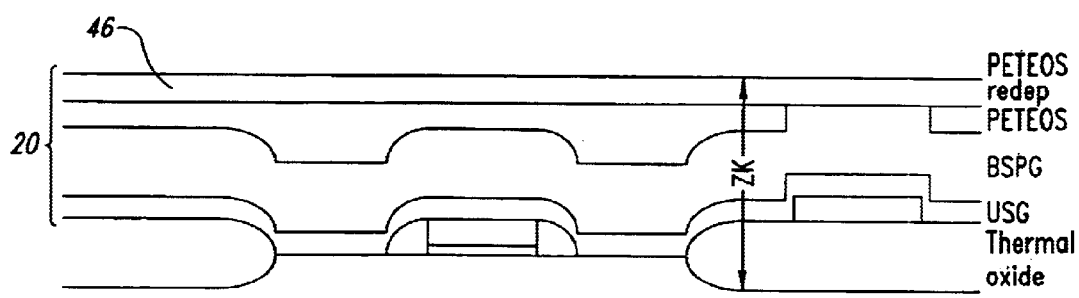
FIG. 6 shows the semiconductor structure of FIG. 5 after the formation of an optional PE-TEOS redeposition layer over the polished USG/BPSG/PE-TEOS stack.

FIGS. 4–6 shows a process for forming a PMD stack 20 according to one embodiment of the invention. Like reference numerals are used to reference elements in common with FIGS. 1–3.

Referring to FIG. 4, a layer 38 is formed over the BPSG layer 6 before CMP. In one embodiment, the layer 38 is conventionally formed from plasma-enhanced tetraethyl orthosilicate (PE-TEOS). The layer 38 acts as a sacrificial layer for the CMP process. In one embodiment, the thickness of the layer 38 is between approximately 8,000–20,000 angstrom, for example about 12,000 angstroms. The thickness of the BPSG layer 6 is between approximately 1,500–8,000 angstroms, for example 6,000 angstroms. The thickness of the USG layer 4 is between approximately 1,000–3,000 angstroms, and the thickness of the field oxide 2 is between approximately 3,000–6,000 angstroms.

Referring to FIG. 5, after the layer 38 is formed, the structure 1 then goes through the CMP process. In one embodiment, the layer 38 is polished until the BPSG layer 6 is exposed. In another embodiment, the polishing stops before the BPSG layer 38 is exposed. In yet another embodiment, the polishing endpoint is empirically determined using a test wafer (not shown). Alternatively, endpoint data provided by the manufacturer of the CMP equipment may be used. After the CMP, the combined thickness yk of all layers, i.e., measured from the bottom of the field oxide 2 to the top of the layer 38, is between approximately 8,000 to 15,000 angstroms. In one embodiment, yk is approximately 13,000 angstroms. Thus, the layers 4 and 6 and the polished layer 38 together compose the PMD stack 20.

Referring to FIG. 6, subsequent to the CMP, an optional redeposition layer 46 may be formed on the layer 38. In one embodiment, the layer 46 is formed from PE-TEOS, has a thickness of approximately 2,000 angstroms, and composes part of the PMD 20. In another embodiment, the layer 46 is formed from TEOS.

All subsequent process steps, such as, e.g., opening windows for tungsten plugs and moralization and finishing manufacturing of the semiconductor structure 1, are conventional and are thus not discussed in detail.

In embodiments where the layer 38 is formed from PE-TEOS, the layer 38 is often harder than the BPSG layer 6, and thus allows the PMD stack 20 to maintain the advantages of the conventional USG/BPSG stack while eliminating the disadvantages of polishing the BPSG layer 6. Furthermore, PE-TEOS has a higher throughput rate during processing than BPSG. Therefore, when formed from PE-TEOS, the layer 38 aids in reducing the processing time by allowing the BPSG layer 6 to have a reduced thickness. Because the thickness of the BPSG layer 6 is reduced, the layer 6 processing time is significantly reduced.

Specifically, in embodiments where the layer 38 is formed from PE-TEOS, the process for PE-TEOS deposition is up to about twice the throughput rate as compared with that of the BPSG deposition process. Furthermore, the PE-TEOS layer 38 is often deposited by using the plasma-enhanced chemical vapor deposition (PECVD) process. Thus, unlike the BPSG process which often requires substantial efforts of equipment cleaning after deposition to avoid defects, equipment for PE-TEOS deposition often require less efforts to clean after deposition. This will cause less down time for the PE-TEOS deposition process than for the BPSG deposition process. In addition, the CMP process normally polishes the PE-TEOS layer 38 more uniformly than it would polish the BPSG layer 6 since there is no problem of non-uniformly distribution of boron and phosphorous ions in the PE-TEOS layer 38. Another advantage of the present invention is that the same PE-TEOS deposition recipe can be used in the CMP process for both the PMD stack 20 and later inter-level dielectric (ILD) layers (not shown), which are dielectric layers conventionally formed after first metallization of the semiconductor structure 1. This often simplifies the manufacturing process of the semiconductor structure 1.

Although the detailed description discloses various embodiments of the invention, other embodiments may be made without deviating form the scope of the invention. In particular, the layer 38 may be formed using a High-Density Plasma Chemical Vapor Deposition (HDPCVD or HDP) technique or even a traditional CVD technique. In alternative embodiments, the respective thicknesses of the layer 38, the USG and BPSG layers 4 and 6, and the field oxide 2 can be fine-tuned to obtain optimal desired characteristics, e.g., gettering effect of mobile ions or to improve the yield of the manufacturing process.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor structure, comprising:

a substrate;

a patterned oxide layer disposed over the substrate;

a layer of undoped silicate glass disposed over the patterned oxide layer, a layer of borophosphorous silicate glass over the layer of undoped silicate glass;

a planarized layer of plasma-enhanced tetraethyl orthosilicate over at least a first portion of the layer of the borophosphorous silicate glass, and not overlaying at least a second portion of the borophosphorous silicate glass layer, the second portion separated by a distance from the first portion; and a layer of plasma-enhanced tetraethyl orthosilicate overlaying the planarized layer of plasma-enhanced tetraethyl orthosilicate and directly overlaying and being in contact with at least the second portion of the borophosphorous silicate glass region, said layer of undoped silicate glass, said layer of borophosphorous silicate glass, said planarized plasma-enhanced tetraethyl orthosilicate, and said layer of plasma-enhanced tetraethyl orthosilicate together forming a pre-metal dielectric stack.

2. The structure of claim 1 wherein the layer of borophosphorous silicate glass has a thickness between approximately 2,000 and 8,000 angstroms.

3. The structure of claim 1 wherein the second layer of plasma-enhanced tetraethyl orthosilicate is planar.

4. The structure of claim 3 wherein a combined thickness of the oxide layer, the layer of undoped silicate glass, the layer of borophosphorous silicate glass, and the second layer of plasma-enhanced tetraethyl orthosilicate is less than 15,000 angstroms.

5. An integrated circuit, comprising:

a substrate;

a first dielectric layer disposed on the substrate;

a layer of undoped silicate glass disposed on the dielectric layer;

an unplanar layer of borophosphorous silicate glass disposed on the layer of undoped silicate glass, said unplanar layer having an uppermost surface;

a planar dielectric layer disposed on the unplanar layer of borophosphorous silicate glass, said planar dielectric layer having an uppermost surface substantially even with the uppermost surface of said unplanar layer of borophosphorous silicate glass; and a second dielectric layer disposed on the planar dielectric layer and the uppermost surface of said unplanar layer of borophosphorous silicate glass, said layer of undoped silicate glass, said layer of borophosphorous silicate glass, said planar dielectric layer, and said second dielectric layer together composing a pre-metal dielectric stack.

6. The integrated circuit of claim 5 wherein the planar dielectric layer comprises plasma-enhanced tetraethyl orthosilicate.

7. The integrated circuit of claim 5 wherein the second dielectric layer is tetraethyl orthosilicate.

8. The integrated circuit of claim 5 wherein the second dielectric layer is plasma-enhanced tetraethyl orthosilicate disposed on the planar dielectric layer; and wherein the planar dielectric layer comprises plasma-enhanced tetraethyl orthosilicate.

9. A semiconductor device sub-structure, comprising:

a substrate;

an oxide layer disposed over the substrate in a pattern having a physical contour of at least one or more recessed portions and at least one or more extended portions;

a layer of undoped silicate glass disposed over the patterned oxide layer and having a physical contour of recessed and extended portions corresponding to the physical contour of the oxide layer;

a layer of doped silicate glass over the layer of undoped silicate glass and having a physical contour of recessed and extended portions corresponding to the physical contour of the layer of undoped silicate glass;

a first substantially planar layer of dielectric material covering at least one or more of the recessed portions of the layer of the doped silicate glass, and exposing at least one or more of the extended portions of the layer of the doped silicate glass layer; and a second layer of dielectric material covering the first substantially planar layer of dielectric material and being in direct contact with the at least one or more extended portions of the layer of the doped silicate glass layer.

10. The device of claim 9 wherein the layer of doped silicate glass is a layer of borophosphorous silicate glass.

11. The device of claim 10 wherein the first layer of dielectric material is a layer of plasma-enhanced tetraethyl orthosilicate.

12. The device of claim 11 wherein the second layer of dielectric material is a layer of plasma-enhanced tetraethyl orthosilicate.

13. The device of claim 12 wherein the second layer of dielectric material is substantially planar.

14. The device of claim 13 wherein the layer of borophosphorous silicate glass has a thickness between approximately 2,000 and 8,000 angstroms.

15. The device of claim 14 wherein a combined thickens of the oxide the layer, the layer of undoped silicate glass, the layer of borophosphorous silicate glass, and the second layer of plasma-enhanced tetraethyl orthosilicate is less than 15,000 angstroms.

16. A semiconductor structure, comprising:

a substrate;

a patterned oxide layer disposed over the substrate;

a layer of undoped silicate glass disposed over the patterned oxide layer;

a layer of borophosphorous silicate glass over the layer of undoped silicate glass, said layer of borophosphorous silicate glass having an upper surface having a highest surface region and a lowest surface region;

a planarized layer of plasma-enhanced tetraethyl orthosilicate disposed on said layer of borophosphorous silicate glass said planarized layer having a thickness less than or approximately equal to a difference in the highest surface region and the lowest surface region of the BPSG layer; and a layer of plasma-enhanced tetraethyl orthosilicate overlaying and being in contact with the planarized layer of plasma-enhanced tetraethyl orthosilicate and directly overlaying and being in contact with the highest surface region of the borophosphorous silicate glass region, said layer of undoped silicate glass, said layer of borophosphorous silicate glass, said planarized plasma-enhanced tetraethyl orthosilicate, and said layer of plasma-enhanced tetraethyl orthosilicate together forming a pre-metal dielectric stack.

\* \* \* \* \*